(12) United States Patent  
Sasaki

(10) Patent No.: US 8,530,994 B2  
(45) Date of Patent: Sep. 10, 2013

(54) METHOD FOR PRODUCING SOLID STATE IMAGING DEVICE AND SOLID-STATE IMAGING DEVICE

(75) Inventor: Shu Sasaki, Iwate-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 71 days.

(21) Appl. No.: 13/172,037

(22) Filed: Jun. 29, 2011

(65) Prior Publication Data

US 2012/0001292 A1    Jan. 5, 2012

(30) Foreign Application Priority Data

Jun. 30, 2010    (JP) ................................ 2010-149619

(51) Int. Cl.  
     *H01L 31/02*      (2006.01)  
(52) U.S. Cl.  
     USPC .......................................................... 257/443  
(58) Field of Classification Search  
     USPC ........................... 257/233, 292, 443, E27.133  
     See application file for complete search history.

(56) References Cited

U.S. PATENT DOCUMENTS

| | | | |
|---|---|---|---|
| 8,084,729 B2 * | 12/2011 | Kato et al. | 250/208.1 |
| 2009/0159944 A1 * | 6/2009 | Oh | 257/292 |
| 2010/0264504 A1 * | 10/2010 | Jeon et al. | 257/432 |

FOREIGN PATENT DOCUMENTS

JP      2005-45141      2/2005

* cited by examiner

*Primary Examiner* — Tan N Tran  
(74) *Attorney, Agent, or Firm* — Oblon, Spivak, McClelland, Maier & Neustadt, L.L.P.

(57) ABSTRACT

Certain embodiments provide a method for producing a solid-state imaging device including the steps of forming an interconnection layer, forming a passivation film, forming a resist layer, forming a plurality of protruding portions and an opening, and forming an electrode pad. In the step of forming the interconnection layer, the interconnection layer is formed on the surface of the semiconductor substrate having a photodiode. In the step of forming the resist layer, the resist layer is formed on the passivation film such that the resist layer has a plurality of first openings above the photodiode and has a second opening above the interconnection of the interconnection layer. In the step of forming the plurality of protruding portions and the opening, the plurality of protruding portions and the opening are formed by etching the passivation film via the resist layer.

7 Claims, 9 Drawing Sheets

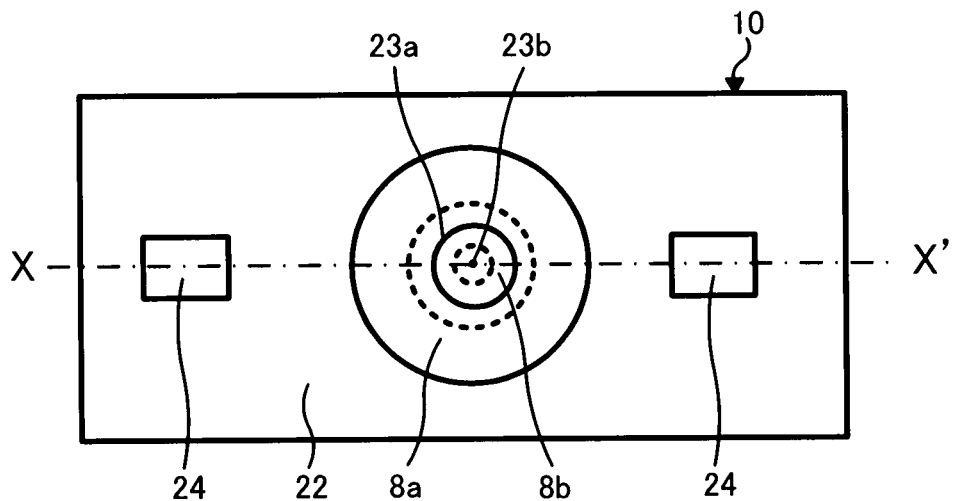
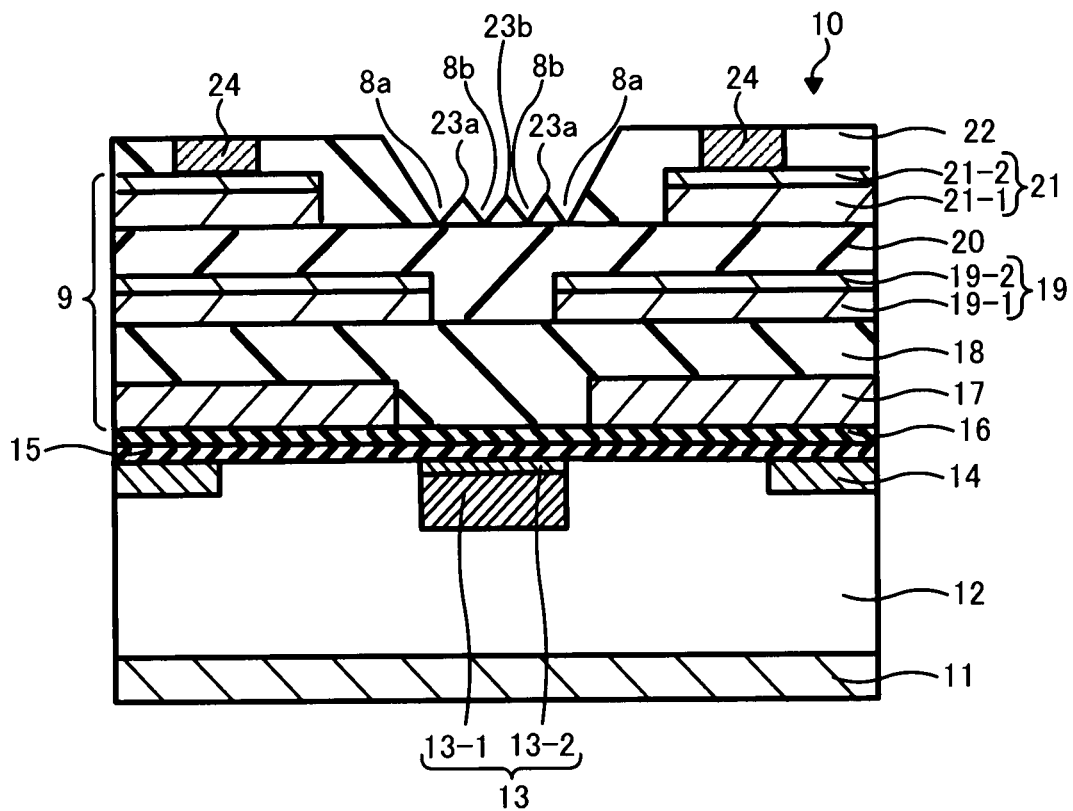

METHOD FOR PRODUCING SOLID STATE IMAGING DEVICE AND SOLID-STATE IMAGING DEVICE

CROSS REFERENCE TO RELATED APPLICATION(S)

This application is based upon and claims the benefit of priority from the prior Japanese Patent Application No. 2010-149619 filed in Japan on Jun. 30, 2010; the entire contents of which are incorporated herein by reference.

FIELD

Embodiments described herein relate generally to a method for producing a solid state imaging device and the solid-state imaging device.

BACKGROUND

A conventional solid-state imaging device has a P-type well layer formed on a surface of an N-type silicon substrate, and embedded photodiodes are formed on the surface of the P-type well layer. On the surface of the silicon substrate having the photodiodes formed thereon, an insulating film is formed. A multi-layer interconnection layer, a passivation as a surface protection film, and a color filter layer are laminated on the insulating film. Microlenses are formed on the color filter layer. The multi-layer interconnection layer has a structure in which a plurality of interconnections and a plurality of inter-layer insulating films are laminated.

The multi-layer interconnection layer in the solid-state imaging device is formed as follows. That is, after interconnection is formed on the insulating film, an inter-layer insulating film is formed on the insulating film including the interconnection. The inter-layer insulating film is made by forming a material serving as the inter-layer insulating film on the insulating film including the interconnection layer and planarizing its surface. As described above, the multi-layer interconnection layer is made by repeatedly forming the interconnection and forming the inter-layer insulating film.

In recent years, a solid-state imaging device without any color filter is desired in some cases. The inventors of the present application have discovered that if a color filter layer is removed from a solid-state imaging device, the amount of light reaching a photodiode with respect to the amount of light incident to the solid-state imaging device via microlenses (hereinafter referred to as "transmittance of the solid-state imaging device") is different according to a wavelength. In other words, the inventors have discovered ripple occurring in transmittance characteristic of the solid-state imaging device.

This ripple is considered to be caused by an increase in the number of multi-layer interconnection layers and planarizing process of the surface of each inter-layer insulating film within the multi-layer interconnection layer by, e.g., CMP (Chemical Mechanical Polishing). More specifically, as the number of multi-layer interconnection layers increases, the distance of the incident light traveling from the microlenses to the photodiodes increases. In addition, it is difficult to diffuse the light reflected by the surface of the silicon substrate because a surface of the inter-layer insulating film is planarized. As a result, light having a particular wavelength is amplified by the interference, and light having the other wavelengths is attenuated by the interference. This is considered to result in ripple.

BRIEF DESCRIPTION OF THE DRAWINGS

FIG. 2 is a top view illustrating an essential portion of the solid-state imaging device according to the present embodiment;

FIG. 3 is a cross sectional view illustrating the solid-state imaging device taken along an alternate long and short dashed line X-X' of FIG. 2;

DETAILED DESCRIPTION

A method for producing a solid-state imaging device according to one of the embodiments includes the steps of forming an interconnection layer, forming a passivation film, forming a resist layer, forming a plurality of protruding portions and an opening, and forming an electrode pad. In the step of forming the interconnection layer, an interconnection layer including an interconnection and an inter-layer insulating film whose surface is planarized are formed via an insulating film on the surface of the semiconductor substrate having the photodiode. In the step of forming the passivation film, the passivation film is formed on the interconnection layer. In the step of forming the resist layer, the resist layer is formed on the passivation film such that the resist layer has a plurality of first openings above the photodiode and has a second opening above the interconnection. In the step of forming the plurality of protruding portions and the opening, the passivation film is etched via the resist layer, a plurality of protruding portions are formed by forming a plurality of recessed portions above the photodiode, and the opening is formed above the interconnection. In the step of forming the electrode pad, an electrode pad connected to the interconnection is formed within the opening.

A solid-state imaging device according to one of the embodiments includes a photodiode, an interconnection layer, a passivation film, a plurality of protruding portions, and an electrode pad. The photodiode is the photodiode formed on a surface of the semiconductor substrate. The interconnection layer is the interconnection layer formed on the surface of the semiconductor substrate via the insulating film and includes an interconnection and an inter-layer insulating film whose surface is planarized. The passivation film is the passivation film formed on the surface of the interconnection layer. The plurality of protruding portions are the plurality of protruding portions made by forming the plurality of recessed portions on the passivation film above the photodiode. The electrode pad is the electrode pad formed on the interconnection so as to be connected to the interconnection.

The method for producing the solid-state imaging device and the solid-state imaging device according to the embodiments will be hereinafter described in detail with reference to the drawings.

First, a line sensor to which the solid-state imaging device according to the embodiment explained later is applied will be hereinafter described with reference to FIG. 1.

Figure 1:
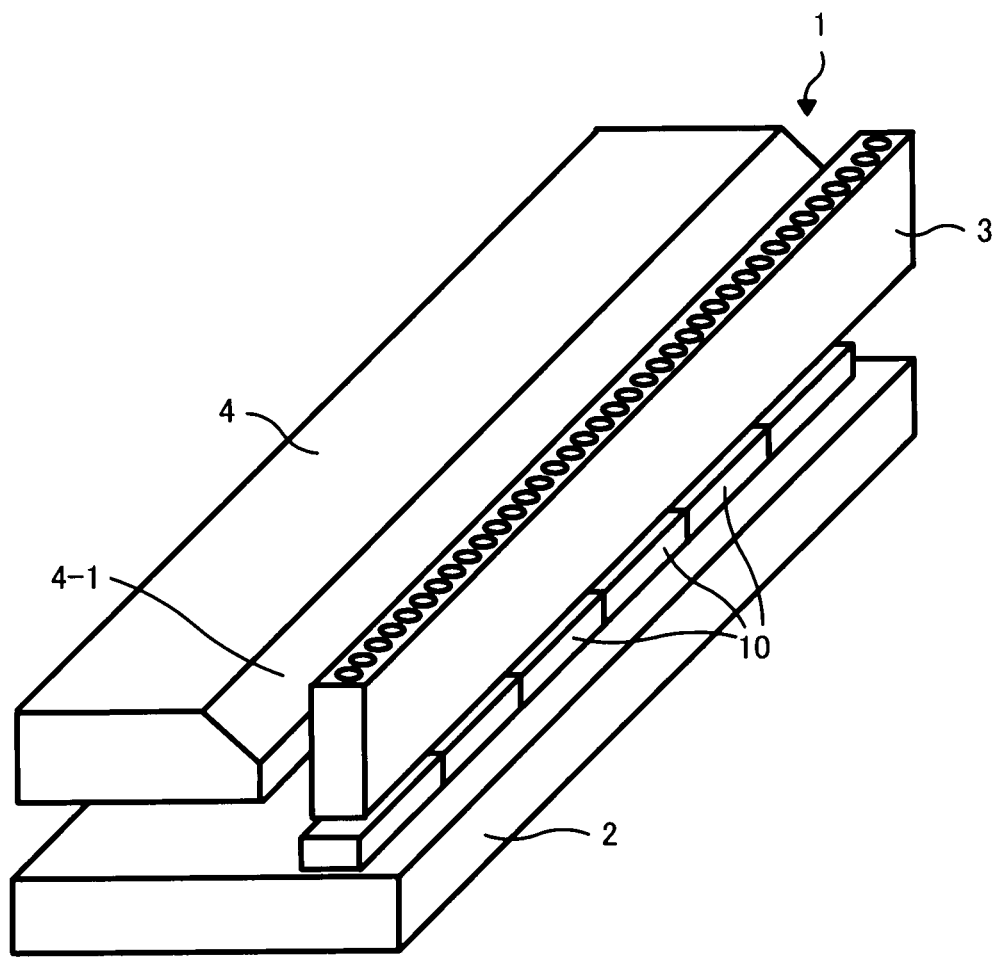
FIG. 1 is a perspective view illustrating a line sensor to which a solid-state imaging device according to an embodiment is applied.

FIG. 1 is a perspective view illustrating the line sensor 1 to which the solid-state imaging device according to the embodiment is applied. A line sensor 1 includes a circuit substrate 2, a plurality of solid-state imaging devices 10, a Selfoc Lens Array 3, and a light guiding body 4. These are placed within a housing (not shown).

The plurality of solid-state imaging devices 10 are arranged adjacent to each other and linearly arranged on the circuit substrate 2. In each solid-state imaging device 10, electrode pads 24 (FIG. 2) explained later are connected to interconnections on the circuit substrate 2 via, e.g., wire (not shown), whereby each solid-state imaging device 10 is electrically connected to the interconnections on the circuit substrate 2.

The Selfoc Lens Array 3 and the light guiding body 4 are disposed above the circuit substrate 2, and are supported by the housing (not shown). The light guiding body 4 has an emission surface 4-1 for emitting light to an original document from light sources (not shown) such as LEDs arranged at the end thereof.

The Selfoc Lens Array 3 is arranged above the circuit substrate 2 such that the light reflected by the original document is focused on the solid-state imaging device. Therefore, the light emitted from the emission surface 4-1 of the light guiding body 4 is reflected by the original document, and thereafter the light enters into the Selfoc Lens Array 3, thereby forming an image on the solid-state imaging device.

Next, the solid-state imaging device 10 applied to the line sensor as shown in FIG. 1 will be explained with reference to FIGS. 2 and 3. FIG. 2 is a top view illustrating one pixel portion of the solid-state imaging device 10. FIG. 3 is a cross sectional view illustrating the solid-state imaging device 10 taken along an alternate long and short dashed line X-X' of FIG. 2.

In the solid-state imaging device 10 shown in FIG. 3, a P-type well 12 is formed on the surface of the P-type silicon semiconductor substrate 11. A photodiode 13 is embedded and formed in the P-type well 12. The photodiode 13 includes an N+ type photodiode layer 13-1 and a P+ type photodiode layer 13-2 formed on the surface of the N+ type photodiode layer 13-1.

The N+ type photodiode layer 13-1 is a layer in which photoelectric conversion is performed. When light enters into the layer, a photo-electric current is generated in accordance with the incident light.

The P+ type photodiode layer 13-2 is a barrier layer for suppressing crystal defect generated in the N+ type photodiode layer 13-1. This layer suppresses generation of a dark current. The P+ type photodiode layer 13-2 is preferably formed. However, it is not necessarily required.

N+ type impurity layers 14 are formed at positions away from the photodiode 13 on the surface of the well 12. The N+ type impurity layers 14 are formed at both sides of the photodiode 13. The N+ type impurity layer 14 is a portion of a transfer gate transistor reading electrical charges generated by the photodiode 13 and accumulating the read electrical charges.

A gate oxide film 15 and an antireflective film 16 are laminated in this order on the surface of the well 12 including the photodiode 13 and the N+ type impurity layers 14. The gate oxide film 15 is made of, e.g., $SiO_2$, and the antireflective film 16 is formed of, e.g., SiN.

It should be noted that the above semiconductor substrate 11 or the gate oxide film 15 include hydrogen. Accordingly, an interface state of an interface between the semiconductor substrate 11 and the gate oxide film 15 is reduced, whereby generation of a dark current is suppressed.

A multi-layer interconnection layer 9 is formed on the surface of the antireflective film 16. The multi-layer interconnection layer 9 includes a gate electrode 17, a first inter-layer insulating film 18, first metal interconnections 19, a second inter-layer insulating film 20, and second metal interconnections 21.

The gate electrode 17 is formed on the surface of the antireflective film 16. The gate electrode 17 is formed in a region including a region above the impurity layer 14 except for a region above the photodiode 13. The gate electrode 17 is made of, e.g., polysilicon.

It should be noted that the transfer gate transistor has the gate electrode 17, the N+ type impurity layer 14, and the well 12 between the impurity layer 14 and the photodiode 13.

The first inter-layer insulating film 18 is formed on the surface of the antireflective film 16 including the gate electrodes 17. The surface of the first inter-layer insulating film 18 is planarized by, e.g., CMP (Chemical Mechanical Polishing) method. The first inter-layer insulating film 18 is made of, for example, $SiO_2$.

The first metal interconnections 19 are formed on the surface of the first inter-layer insulating film 18. The first metal interconnections 19 are formed in regions except the region above the photodiode 13. For example, the first metal interconnection 19 includes an Al layer 19-1 and a barrier metal layer 19-2 made of Ti/TiN and laminated on the surface of the Al layer 19-1.

The second inter-layer insulating film 20 is formed on the surface of the first inter-layer insulating film 18 including the first metal interconnections 19. The surface of the second inter-layer insulating film 20 is planarized by, e.g., CMP method. The second inter-layer insulating film 20 is made of, for example, $SiO_2$.

The second metal interconnections 21 are formed on the surface of the second inter-layer insulating film 20. The second metal interconnections 21 are formed in a region except the region above the photodiode 13. Like the first metal interconnection 19, the second metal interconnection 21 includes, for example, an Al layer 21-1 and a barrier metal layer 21-2 made of Ti/TiN and laminated on the surface of the Al layer 21-1.

In the multi-layer interconnection layer 9, the gate electrode 17 and the first metal interconnection 19 are connected with each other via, for example, a penetrating electrode (not shown) penetrating through the first inter-layer insulating film 18, and the first metal interconnection 19 and the second metal interconnection 21 are connected with each other via for example, a penetrating electrode (not shown) penetrating through the second inter-layer insulating film 20.

A passivation film 22 is formed on the surface of the multi-layer interconnection layer 9, i.e., on the surface of the second inter-layer insulating film including the second metal interconnections 21. The passivation film 22 is made of, for example, SiN. Alternatively, it may be made of $SiO_2$.

The plurality of recessed portions 8a and 8b are formed in the passivation film 22. Each of recessed portions 8a and 8b is formed in a V shape and penetrating through the passivation film 22. By forming these recessed portions 8a and 8b, a plurality of protruding portions 23a and 23b are formed.

As show in FIG. 2, the recessed portion 8a and the recessed portion 8b are circles respectively. It is different from a radius of the recessed portion 8a and a radius of the recessed portion 8b. The recessed portion 8a and the recessed portion 8b are formed like a concentric circle. Therefore, the protruding portion 23a and the protruding portion 23b are also circles respectively and are formed like the concentric circle.

Referring to FIG. 3 again, the plurality of recessed portions 8a and 8b (the plurality of protruding portions 23a and 23b) are formed in a region between the second metal interconnections 21, i.e., above the photodiode 13.

The plurality of recessed portions 8a and 8b (the plurality of protruding portions 23a and 23b) are diffused the light reflected by the surface of the silicon semiconductor substrate 11.

The electrode pads 24 are formed in some portions on the second metal interconnections 21. The electrode pads 24 are formed to be embedded in the passivation film 22. The electrode pad 24 is, for example, electrically connected to the gate electrode 17 via the second metal interconnection 21 and the first metal interconnection 19, and is used to apply voltage to the gate electrode 17.

A planarized transparent resist layer (not shown) is laminated on the surface of the passivation film 22 including the electrode pads 24 and the plurality of recessed portions 8a, 8b (the plurality of protruding portions 23a and 23b), and microlenses (not shown) are formed on the surface of the resist layer. The microlenses (not shown) are formed above the photodiode 13.

No color filter is formed between the microlenses and the transparent resist layer. In other words, the solid-state imaging device 10 according to the present embodiment is a solid-state imaging device that does not have any color filter.

Next, the method for producing the solid-state imaging device 10 according to the present embodiment will be explained with reference to FIGS. 4 to 13. FIGS. 4 to 13 are cross sectional views corresponding to FIG. 3 for illustrating steps for producing the solid-state imaging device 10.

Figure 4:
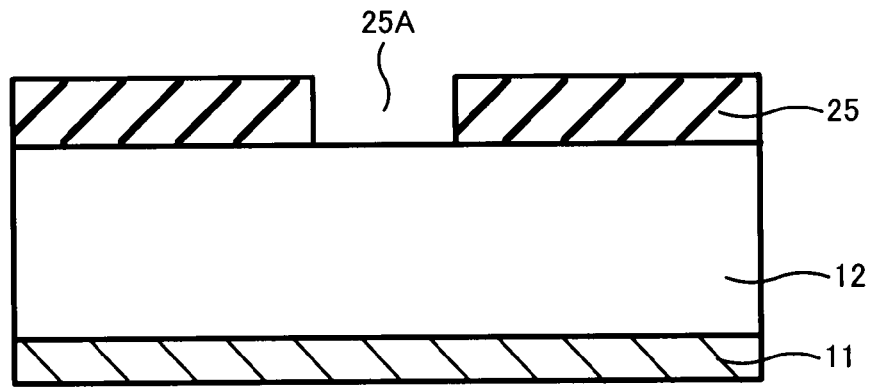
FIG. 4 is a cross sectional view corresponding to FIG. 3 for illustrating steps for producing the solid-state imaging device according to the present embodiment, and more specifically, illustrating steps for forming a photodiode.

First, as shown in FIG. 4, a first resist layer 25 having an opening 25A for forming the photodiode 13 is formed on the surface of the P-type well 12 formed on the surface of the P-type silicon semiconductor substrate 11.

Figure 5:
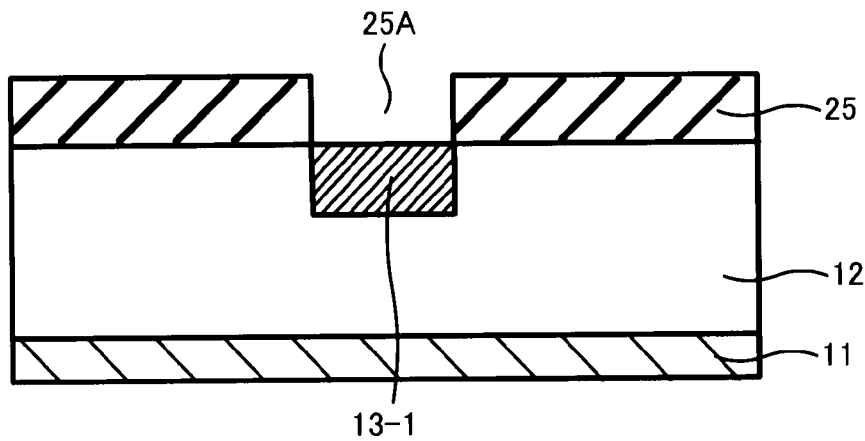
FIG. 5 is another cross sectional view corresponding to FIG. 3 for illustrating steps for producing the solid-state imaging device according to the present embodiment, and more specifically illustrating steps for forming the photodiode.

Next, as shown in FIG. 5, using the first resist layer 25 as a mask, the N-type impurity is doped on the surface of the semiconductor substrate 11. With the above steps, the N+ type photodiode layer 13-1 is formed.

Figure 6:
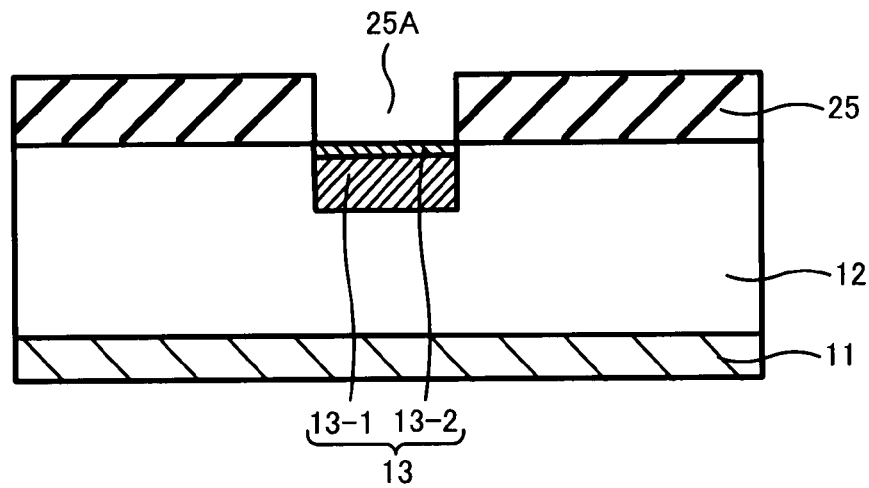
FIG. 6 is still another cross sectional view corresponding to FIG. 3 for illustrating steps for producing the solid-state imaging device according to the present embodiment, and more specifically illustrating steps for forming the photodiode.

Next, as shown in FIG. 6, further using the first resist layer 25 as a mask, the P-type impurity is doped on the surface of the semiconductor substrate 11. With the above steps, the P+ type photodiode layer 13-2 is formed on the surface of the N+ type photodiode layer 13-1.

Thereafter, the first resist layer 25 is removed and each of the photodiode layers 13-1 and 13-2 are diffused by heat. With the above steps, the photodiode 13 is formed.

The impurity ion implantation step as shown in FIG. 6 may include removing the first resist layer 25 and thereafter doping the P-type impurity on the entire surface of the semiconductor substrate 11. These steps can prevent diffusion of crystal defect on the surface of the semiconductor substrate 11. This method is effective when a pixel pitch is wide. However, when the pixel pitch is narrow, the P-type impurity is preferably doped via the first resist layer 25 as described above.

Figure 7:
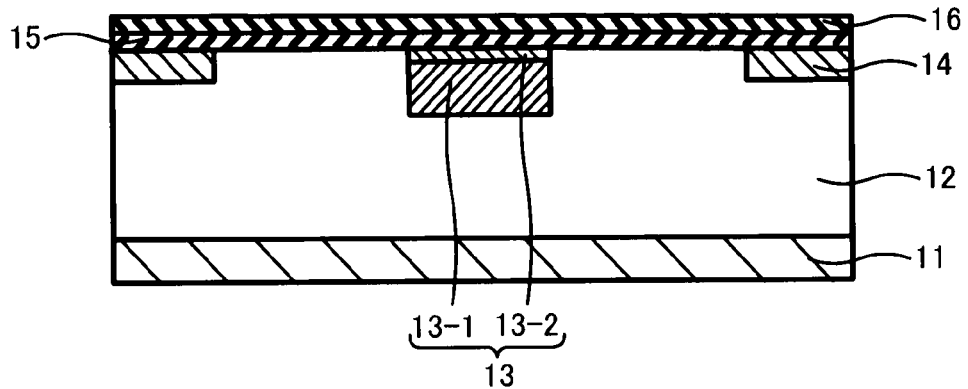
FIG. 7 is a cross sectional view corresponding to FIG. 3 for illustrating steps for producing the solid-state imaging device according to the present embodiment, and more specifically illustrating steps for forming a gate oxide film and an antireflective film.

Next, as shown in FIG. 7, on the surface region of the semiconductor substrate 11, the N– type impurity is ion-implanted at positions away from the photodiode 13, and thereafter thermal diffusion processing is performed, so that the N+ type impurity layer 14 is formed. Further, the gate oxide film 15 and the antireflective film 16 formed in this order on the surface region of the semiconductor substrate 11 including the N+ type impurity layer 14 and the photodiode 13.

Figure 8:
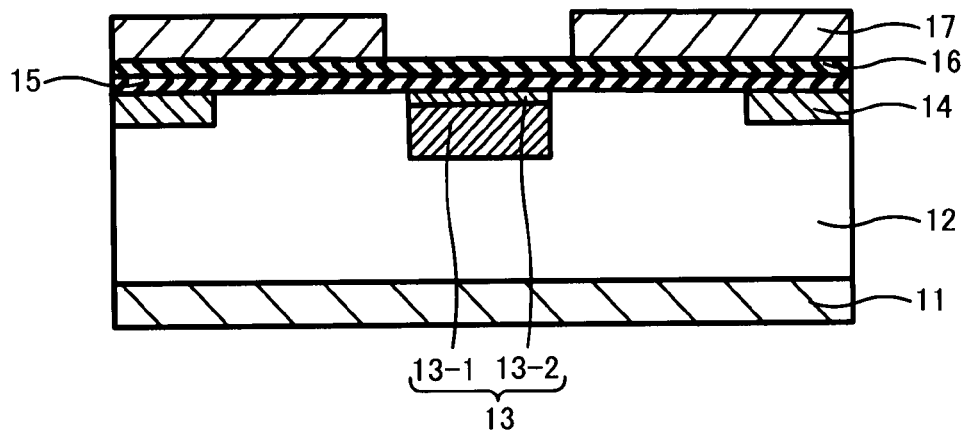
FIG. 8 is a cross sectional view corresponding to FIG. 3 for illustrating steps for producing the solid-state imaging device according to the present embodiment, and more specifically illustrating steps for forming a gate electrode.

Thereafter, the multi-layer interconnection layer 9 is formed on the surface of the antireflective film 16. More specifically, first, as shown in FIG. 8, the gate electrodes 17 are formed in predetermined regions on the surface of the antireflective film 16. The gate electrodes 17 are made by forming, e.g., polysilicon having a thickness of 500 nm on the antireflection film 16 and thereafter performing patterning process.

Figure 9:
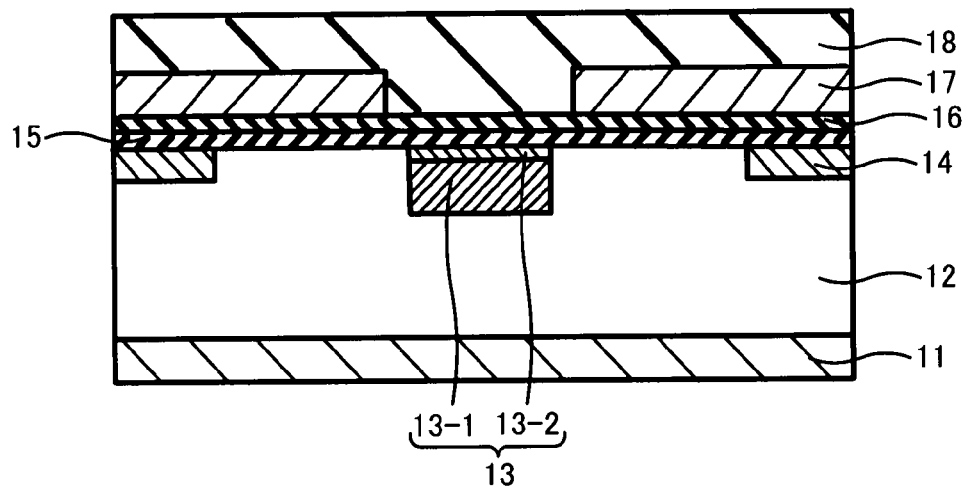
FIG. 9 is a cross sectional view corresponding to FIG. 3 for illustrating steps for producing the solid-state imaging device according to the present embodiment, and more specifically illustrating steps for forming a first inter-layer insulating film.

Next, as shown in FIG. 9, an insulating material (e.g., $SiO_2$) is formed on the antireflective film 16 including the gate electrodes 17, and the surface thereof is planarized by CMP method, whereby, for example, the first inter-layer insulating film 18 having a thickness of about 100 nm or more is formed.

Figure 10:
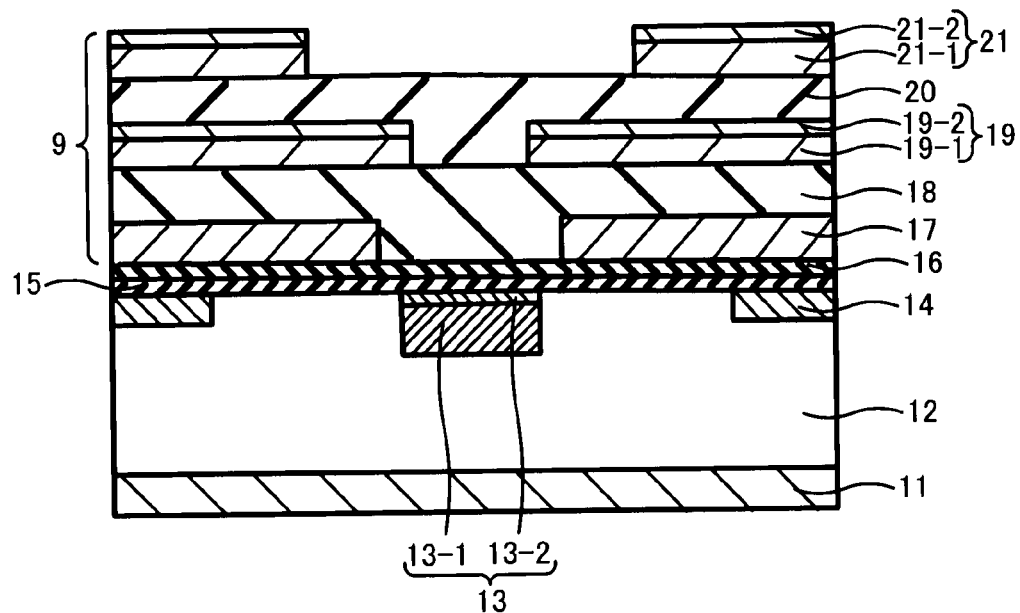
FIG. 10 is a cross sectional view corresponding to FIG. 3 for illustrating steps for producing the solid-state imaging device according to the present embodiment, and more specifically illustrating steps for forming a first interconnection, a second inter-layer insulating film, and a second interconnection.

Subsequently, as shown in FIG. 10, the first metal interconnections 19, for example, having a thickness of about 100 nm or more are formed in predetermined regions on the planarized surface of the first inter-layer insulating film 18.

The first metal interconnection 19 is formed by evaporating, e.g., Al and Ti/TiN in this order.

Further, an insulating material (e.g., SiO$_2$) is formed on the first inter-layer insulating film 18 including the first metal interconnections 19, and the surface thereof is planarized by CMP method, whereby, for example, the second inter-layer insulating film 20 having a thickness of about 100 nm or more is formed.

Further, for example, the second metal interconnections 21 having a thickness of about 100 nm or more are formed in predetermined regions on the planarized surface of the second inter-layer insulating film 20. The method for forming the second metal interconnections 21 are the same as the method for forming the first metal interconnection 19.

With the steps shown in FIGS. 8 to 10, the multi-layer interconnection layer 9 is formed on the surface of the anti-reflective film 16.

Figure 11:
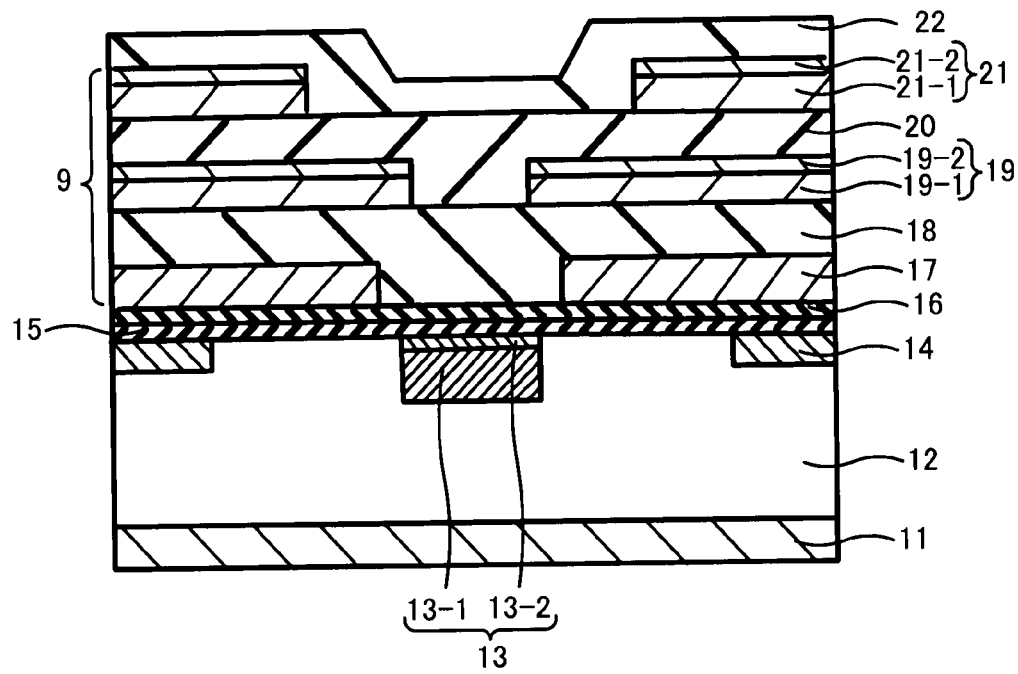
FIG. 11 is a cross sectional view corresponding to FIG. 3 for illustrating steps for producing the solid-state imaging device according to the present embodiment, and more specifically illustrating steps for forming a passivation film.

Next, as shown in FIG. 11, for example, the passivation film 22 having a thickness of about 100 nm or more is formed on the surface of the multi-layer interconnection layer 9, i.e., on the surface of the second inter-layer insulating film 20 including the second metal interconnections 21.

Figure 12:
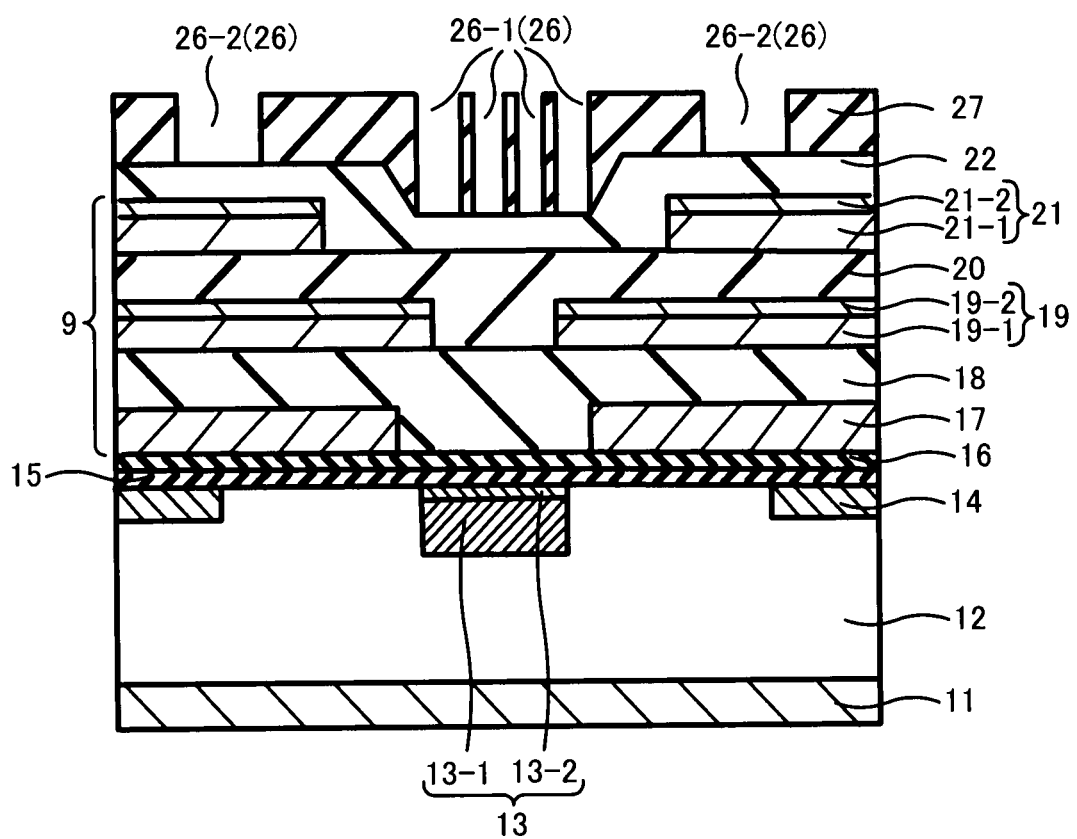
FIG. 12 is a cross sectional view corresponding to FIG. 3 for illustrating steps for producing the solid-state imaging device according to the present embodiment, and more specifically illustrating steps for forming a plurality of micro-protrusions.

Next, as shown in FIG. 12, the second resist layer 27 is formed on the surface of the passivation film 22. The second resist layer 27 has the plurality of openings 26 for forming the plurality of recessed portions 8a and 8b (FIG. 3) and the electrode pads 24 (FIG. 3).

Among the plurality of openings 26, the plurality of first openings 26-1 for forming the plurality of recessed portions 8a and 8b are in a tubelike shape. The plurality of first openings 26-1 are formed concentrically on the passivation film 22 between the second metal interconnections 21. Among the plurality of openings 26, second openings 26-2 for forming the electrode pads 24 are in a cubic shape, and are formed in the predetermined regions on the passivation film 22 formed on the second metal interconnections 21.

Figure 13:
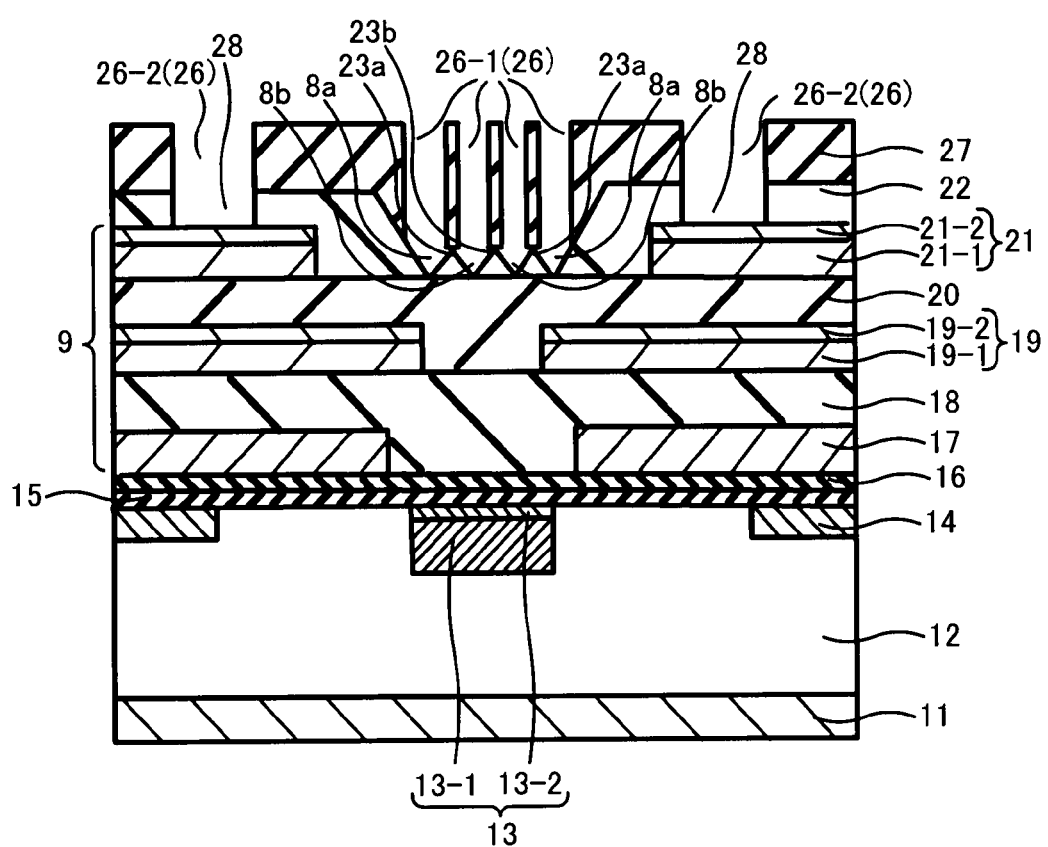
FIG. 13 is another cross sectional view corresponding to FIG. 3 for illustrating steps for producing the solid-state imaging device according to the present embodiment, and more specifically illustrating steps for forming a plurality of micro-protrusions.

Next, as shown in FIG. 13, using the second resist layer 27 as a mask, the passivation film 22 is wet-etched. When the passivation film 22 is etched, for example, an etchant of hydrofluoric acid series is used. As a result, the plurality of recessed portions 8a and 8b (the plurality of protruding portions 23a and 23b) and openings 28 for forming the electrode pads 24 (FIG. 3) are formed on the passivation film 22.

Finally, the second resist layer 27 is removed, and the electrode pads 24 are formed on the openings formed on the passivation film 22, so that the solid-state imaging device 10 as shown in FIG. 3 is produced.

In the steps for etching the passivation film 22 shown in FIG. 13, the means of etching is preferably wet etching. On the contrary, dry etching according to RIE method using CF4/Ar is not a preferable method as the means of etching. The reason for this is as follows.

If the dry etching according to RIE method using CF4/Ar is performed in the etching steps as shown in FIG. 13, for example, the Al layer 21-1 of the second metal interconnection 21 is bonded to residual fluorine caused by the dry etching. Therefore, it is necessary to heat the Al layer 21-1 to about 300 to 350 degrees Celsius to remove the fluorine from the Al layer 21-1. However, hydrogen included in the silicon semiconductor substrate 11 or the gate oxide film 15 is diffused by heating. As a result, there is a problem in that a dark current increases in the produced solid-state imaging device 10. Therefore, it is not a preferable method to employ the dry etching.

As described above, according to the solid-state imaging device produced by the method for producing the solid-state imaging device 10 according to the present embodiment, the plurality of recessed portions 8a and 8b (the plurality of protruding portions 23a and 23b) are formed on the passivation film 22. Therefore, the light reflected by the surface of the silicon semiconductor substrate 11 is diffused by the plurality of protruding portions 23a and 23b. Accordingly, the solid-state imaging device 10 is provided to suppress the ripple occurring in the transmittance characteristic.

Figure 14:
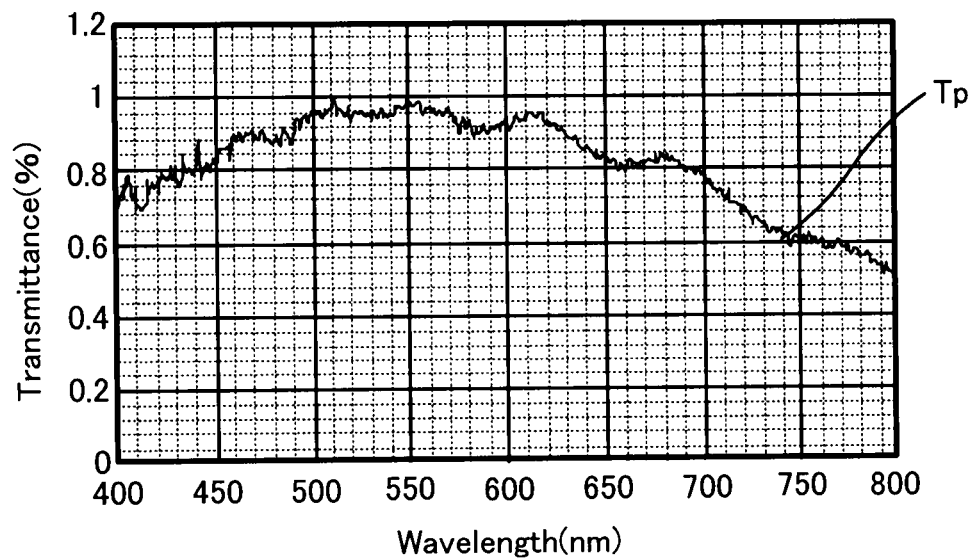
FIG. 14 is a graph illustrating transmittance characteristic of light in the solid-state imaging device according to the present embodiment.

The inventors have confirmed the transmittance characteristic of the solid-state imaging device according to the present embodiment through some experiments. FIG. 14 is a graph illustrating transmittance characteristic of light in the solid-state imaging device 10 according to the present embodiment. In the figure, the horizontal axis represents a wavelength of light, and the vertical axis represents a transmittance. In the figure, a curved line Tp represents transmittance characteristic. As shown in FIG. 14, the transmittance characteristic Tp of the light in the solid-state imaging device 10 indicates that the transmittance did not vary greatly depending on the wavelength and that no ripple was found.

Figure 15:
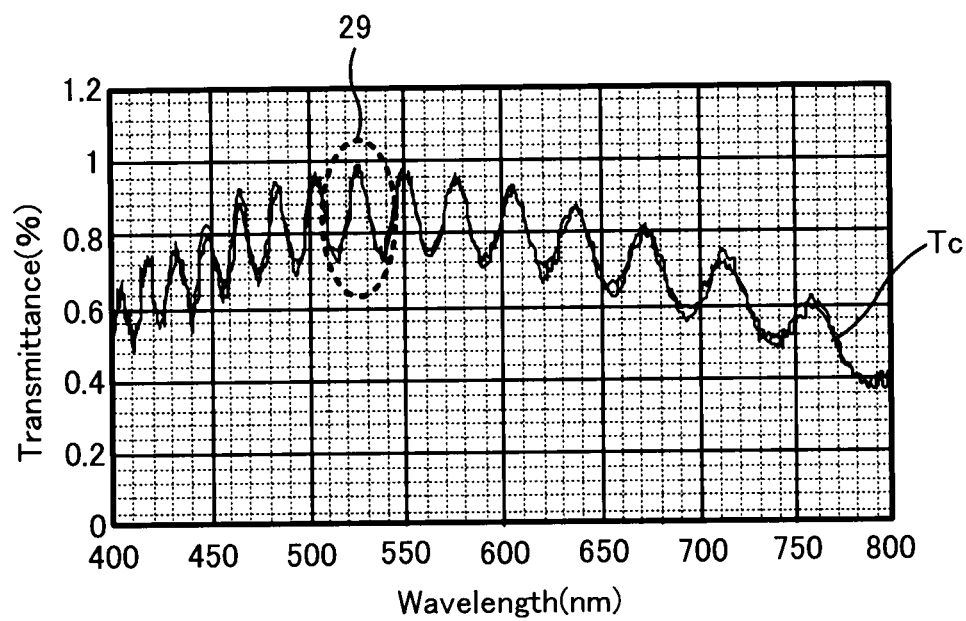
FIG. 15 is a graph illustrating transmittance characteristic of light in a conventional solid-state imaging device.

In addition, a transmittance characteristic of a conventional solid-state imaging device was also confirmed through experiments. FIG. 15 is a graph illustrating transmittance characteristic of light in the conventional solid-state imaging device. In the figure, the horizontal axis represents a wavelength of light, and the vertical axis represents a transmittance. In the figure, a curved line Tc represents transmittance characteristic. As shown in FIG. 15, it was confirmed that the transmittance characteristic Tc of the light in the conventional solid-state imaging device vary greatly depending on the wavelength. In other words, it was confirmed that a plurality of ripples 29 were generated in the light transmittance characteristic Tc.

As a result of the comparison between FIGS. 14 and 15 as explained above, it was confirmed that the solid-state imaging device 10 according to the present embodiment could suppress the ripple occurring in the transmittance characteristic.

On the other hand, according to the method for producing the solid-state imaging device 10 according to the present embodiment, the plurality of recessed portions 8a and 8b and the openings 28 for forming the electrode pads 24 are formed at a time. Therefore, it is not necessary to form them in separate steps, and this can reduce the process of producing the solid-state imaging device.

Further, according to the method for producing the solid-state imaging device 10 according to the present embodiment, the plurality of recessed portions 8a and 8b and the openings 28 for forming the electrode pads 24 are not formed by the dry etching according to RIE method using CF4/Ar but are formed by the wet etching. Therefore, diffusion of hydrogen included in the silicon semiconductor substrate 11 or the gate oxide film 15 is suppressed, and an increase in the dark current is suppressed.

Figure 16:
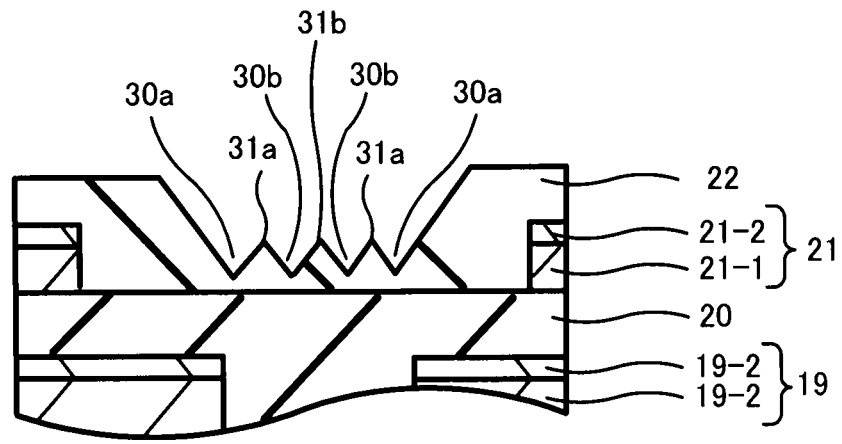
FIG. 16 is an enlarged view illustrating a modification of a plurality of recessed portions (a plurality of protruding portions)
Figure 17:
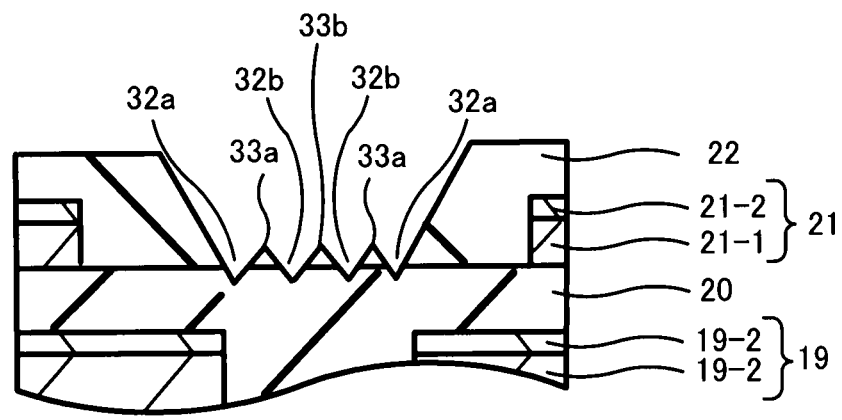
FIG. 17 is an enlarged view illustrating a modification of a plurality of recessed portions (a plurality of protruding portions)
Figure 18:
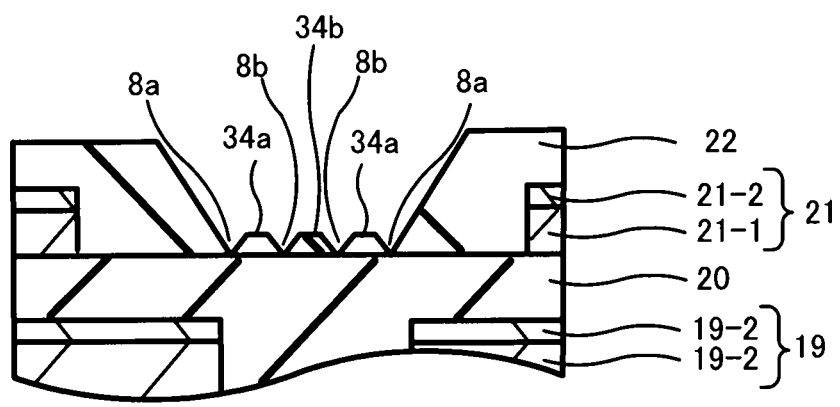
FIG. 18 is an enlarged view illustrating a modification of a plurality of recessed portions (a plurality of protruding portions).

Finally, a modification of the plurality of recessed portions 8a and 8b (the plurality of protruding portions 23a and 23b) will be explained with reference to FIGS. 16 to 18. FIGS. 16 to 18 are enlarged views each illustrating a modification of the plurality of recessed portions (the plurality of protruding portions).

Alternatively, as shown in FIG. 16, a plurality of protruding portions 31a and 31b may be formed by forming a plurality of recessed portions 30a and 30b as shallow recessed portions so as not to penetrate through the passivation film 22.

The plurality of recessed portions 30a and 30b (the plurality of protruding portions 31a and 31b) provide wider opening widths of the plurality of first openings 26-1 shown in FIG. 12 and result in a shorter etching time than the time in the case where the plurality of recessed portions 8a and 8b (the plurality of protruding portions 23a and 23b) are formed.

Alternatively, as shown in FIG. 17, the plurality of protruding portions 33a and 33b may be formed by forming the plurality of recessed portions 32a and 32b as deep recessed portions so as to penetrate through the passivation film 22 and to reach the second inter-layer insulating film 20.

The plurality of recessed portions 32a and 32b (the plurality of protruding portions 33a and 33b) provide narrower opening widths of the plurality of first openings 26-1 shown in FIG. 12 and result in a longer etching time than the time in the case where the plurality of recessed portions 8a and 8b (the plurality of protruding portions 23a and 23b) are formed.

As shown in FIG. 18, the plurality of protruding portions 34a and 34b do not need to have a sharp end. Alternatively, the end may be in a flat shape. For example, in the step as shown in FIG. 13, the intervals between the first openings 26-1 may be increased. The same applies to the plurality of protruding portions 31a, 31b, 33a, and 33b as shown in FIGS. 16 and 17, respectively.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

For example, the conductive type of the above solid-state imaging device 10 is not limited. Further, each member comprising the solid-state imaging device 10 is not limited. Further, the number of layers in the multi-layer interconnection layer 9 is not limited.

What is claimed is:

1. A solid-state imaging device comprising:
   a photodiode formed on a surface of a semiconductor substrate;
   an interconnection layer including an interconnection and an inter-layer insulating film whose surface is planarized and formed via an insulating film on the surface of the semiconductor substrate;
   a passivation film formed on a surface of the interconnection layer;
   a plurality of protruding portions made by concentrically forming a plurality of recessed portions which are circles respectively, whose radiuses are mutually different, in the passivation film directly above the photodiode; and
   an electrode pad formed on the interconnection so as to be connected to the interconnection.

2. The solid-state imaging device according to claim 1, wherein the semiconductor substrate or the insulating film is a semiconductor substrate or an insulating film including hydrogen.

3. The solid-state imaging device according to claim 1, wherein the plurality of recessed portions penetrate through the passivation film.

4. The solid-state imaging device according to claim 1, wherein the plurality of recessed portions do not penetrate through the passivation film.

5. The solid-state imaging device according to claim 1, wherein the plurality of protruding portions have sharp ends.

6. The solid-state imaging device according to claim 1, wherein the plurality of protruding portions have flat ends.

7. A solid-state imaging device comprising:
   a photodiode formed on a surface of a semiconductor substrate;
   a plurality of gate electrodes formed via an insulating film on the surface of the semiconductor substrate except for a surface of the photodiode;
   a first inter-layer insulating film having a flat surface, the first inter-layer insulating film formed on a surface of the insulating film including surfaces of the gate electrodes;
   a plurality of first interconnections formed on the flat surface of the first inter-layer insulating film, the first interconnections formed directly above the gate electrodes;
   a second inter-layer insulating film having a flat surface, the second inter-layer insulating film formed on the flat surface of the first inter-layer insulating film including surfaces of the first interconnections;
   a plurality of second interconnections formed on the flat surface of the second inter-layer insulating film, the second interconnections formed directly above the first interconnections;
   a passivation film formed on the flat surface of the second inter-layer insulating film including surfaces of the second interconnections, the passivation film between the second interconnections having an opening directly above the photodiode;
   a plurality of protruding portions formed in the passivation film between the second interconnections, the protruding portions formed in the opening of the passivation film,
   wherein the protruding portions are circles respectively, whose radiuses are mutually different, and are formed concentrically.

\* \* \* \* \*